United States Patent [19]

Visser

[11] Patent Number: 5,177,878
[45] Date of Patent: Jan. 12, 1993

[54] APPARATUS AND METHOD FOR TREATING FLAT SUBSTRATE UNDER REDUCED PRESSURE IN THE MANUFACTURE OF ELECTRONIC DEVICES

[75] Inventor: Jan Visser, Eindhoven, Netherlands

[73] Assignee: U.S. Philips Corporation, New York, N.Y.

[21] Appl. No.: 613,667

[22] PCT Filed: May 7, 1990

[86] PCT No.: PCT/NL90/00063
§ 371 Date: Dec. 6, 1990
§ 102(e) Date: Dec. 6, 1990

[87] PCT Pub. No.: WO90/13687
PCT Pub. Date: Nov. 15, 1990

[30] Foreign Application Priority Data

May 8, 1989 [DE] Fed. Rep. of Germany ....... 3915039
May 9, 1989 [FR] France ................... 8906057

[51] Int. Cl.⁵ .............................. F26B 13/30
[52] U.S. Cl. ........................... 34/92; 34/233; 34/239
[58] Field of Search ............... 34/92, 60, 15, 17, 10, 34/57 R, 232, 233, 239

[56] References Cited

U.S. PATENT DOCUMENTS 3,717,439  2/1973  Sakai .................. 34/12 X
4,565,601  1/1986  Kakehi ................. 34/12 X

FOREIGN PATENT DOCUMENTS 3633386  4/1988  Fed. Rep. of Germany ..... 34/12 X
245778  12/1985  Japan ................... 34/12 X
2114813  8/1983  United Kingdom .......... 34/12 X Primary Examiner—Henry A. Bennet
Attorney, Agent, or Firm—Paul R. Miller

[57] ABSTRACT

Apparatus and method is set forth for treating a flat substrate (10), more particularly a semiconductor wafer in the manufacture of integrated circuits, under reduced pressure comprising a vacuum chamber (2a, 2b) provided with a substrate support (11) having a body (11a) with heating and/or cooling means (12) and a supporting surface (11b) at which a plurality of injection openings (20) is present communicating with an injection space (12) and a supplementary gas inlet (28), through which injection openings a gas is supplied between the substrate and the supporting surface for forming a heat-exchanging gas cushion therebetween. At the supporting surface (11b) also a plurality of exhaust openings (29) is present communicating with an exhaust space (24) and an exhaust outlet (18) through which exhaust openings gas form between the substrate (10) and the supporting surface is exhausted, so that, while maintaining the gas cushion, gas injected through each of the injection openings is exhausted through adjacent openings. Thus the injected gas practically will not reach the periphery of the substrate and thus does not interfere with gases in the reaction chamber.

22 Claims, 4 Drawing Sheets

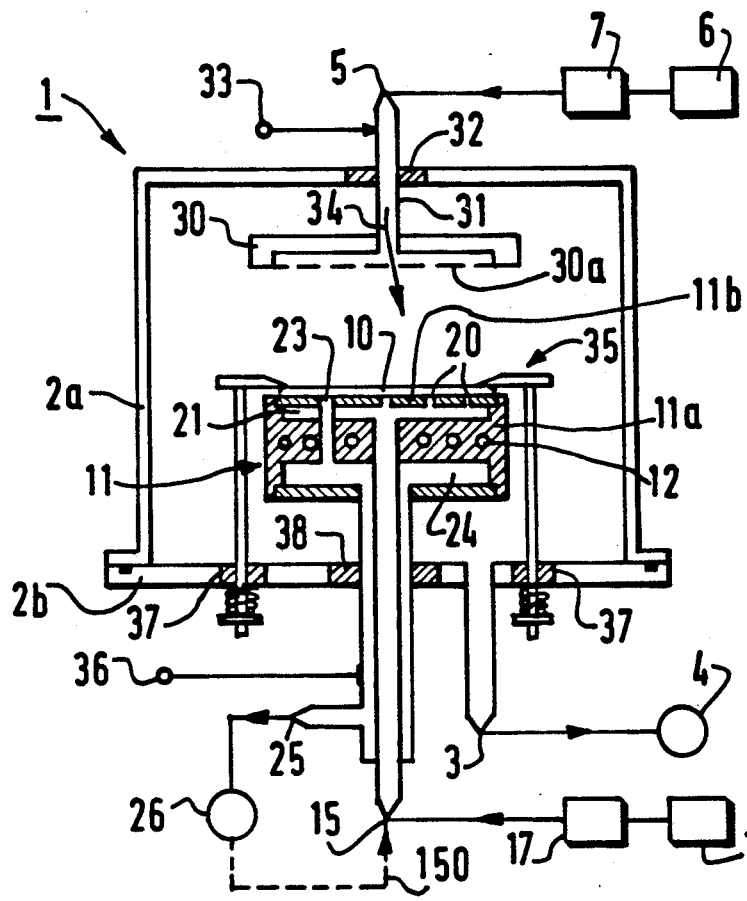
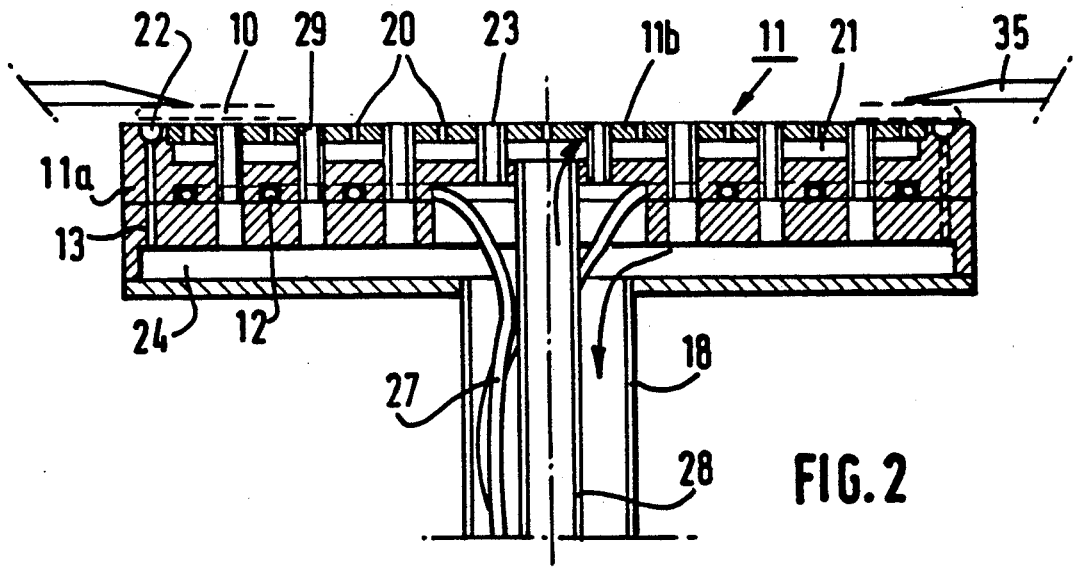
FIG. 1
FIG. 2

APPARATUS AND METHOD FOR TREATING FLAT SUBSTRATE UNDER REDUCED PRESSURE IN THE MANUFACTURE OF ELECTRONIC DEVICES

The invention relates to an apparatus for treating a flat substrate more particularly a semiconductor wafer, under reduced pressure comprising a vacuum chamber provided with a substrate support having a body with heating and/or cooling means and a supporting surface at which a plurality of injection openings is present communicating with an injection space and a supplementary gas inlet, through which injection openings a gas can be supplied between the substrate and the supporting surface for forming a heat-exchanging gas cushion therebetween.

The invention also relates to a method of manufacturing electronic devices in which a flat substrate, more particularly a semiconductor wafer in the manufacture of integrated circuits, is treated under reduced pressure in an apparatus as mentioned before.

BACKGROUND OF THE INVENTION

The treatments necessary for the manufacture of semiconductor integrated circuits utilize for a large part processes of depositing or etching carried out in a treatment gas or of a mixture of several gases under reduced pressure. Besides the process of low-pressure chemical vapour deposition, known under the designation LPCVD, in which a chemical reaction is obtained merely due to the high temperature to which the substrate is brought, other processes more frequently give rise to an activation of the treatment gas by a plasma formed in the vacuum chamber, in which processes the substrate, in electrical connection with its support, forms one of the electrodes, while another electrode is disposed parallel to the substrate at a given distance therefrom.

Depending upon the type of process to be used, the power of the electrical field applied to the electrodes for producing the plasma can be greatly different, while the temperature at which the substrate must be kept can also vary within wide limits. As a result, in general a heat flow must be provided between the substrate and its support in one or the other direction, that is to say to that the substrate when the losses by radiation are preponderant, or to cool it when the power used in the plasma is high and exceeds the radiation losses.

Finally, annealing treatments at given temperatures in accordance with a very rapid cycle (less than one minute) are also susceptible to being carried out in a vacuum chamber, in which a atmosphere of a neutral (or reducing) gas may be established under reduced pressure in a chamber, or in a high-vacuum. Such rapid annealing treatments are used inter alia to obtain microalloys between materials of different kinds, which are initially superimposed.

It is well known that it is difficult to obtain a satisfactory heat exchange between a substrate and its support when the assembly is arranged in a chamber under reduced pressure. Now, this heat exchange plays an essential part in the control of the temperature to which the substrate must be brought during the treatment to obtain a temperature homogeneity of the substrate as satisfactory as possible and to obtain, if necessary, a speed of temperature increase of the substrate and a speed of cooling as high as possible. The processes of treatment in a vacuum or in a partial vacuum are in fact mostly very sensitive to the temperature so that a poor control of the temperature of the substrate would involve an unacceptable dispersion of the results both between one operation and the other and as a function of the position on the surface of the same substrate.

In order to meet these difficulties, it has already been proposed to inject between the back surface of the substrate and the supporting surface of the support a gas thus forming a heat-exchanging gas cushion therebetween facilitating the heat exchange between the substrate and the supporting surface of the support, whose temperature can be regulated in an active manner.

An apparatus utilizing such a technique and corresponding to the definition given in the introductory paragraph is known from the document German application No. DE-A-36 33 386.

In the known apparatus the gas injected under the back surface of the substrate flows along this surface and escapes at its periphery, at which it then reaches the atmosphere of the vacuum chamber. A flow of He or the treatment gas is used to obtain the heat exchange between the substrate and the support.

The fact that, in order to obtain the thermal contact of the substrate, the same gas is used as that by which the reaction provided in the treatment is fed, imposes serious problems.

In the first place, the reaction gas is not always the most effective with respect to the thermal conduction and it would be very desirable that the gas of one's own choice can be used, independently of the treatment gas. In the second place, the escape into the space of the gas having served for the heat exchange between the carrier and the substrate will influence the pressure in the vacuum chamber in the proximity of the periphery of the substrate.

If another gas than the treatment gas should be used for obtaining the thermal conduction between the substrate and its support, a difficulty could be met due to the inhomogeneity of the gas in the chamber because the gas injected under the substrate is finally mixed with the gas in the chamber at the periphery of the substrate. It would be possible to reduce this effect by considerably reducing the flow of gas injected under the substrate, but this measure again leads to a limitation with regard to the possibilities of heat exchange between the substrate and the support.

Otherwise, when using the same gas as the treatment gas and when the latter is susceptible to being decomposed under the influence of an increase in temperature, this decomposition starts at the passage of this gas through the support. In this case, the result consists in undesirable deposits within the support, at its surface and at the back surface of the substrate.

SUMMARY OF THE INVENTION

The invention has inter alia for its object to provide an apparatus in which the kind of gas injected under the back surface of the substrate can be chosen freely, while avoiding the disturbance of the atmosphere in the reaction chamber in the proximity of the substrate. The invention further has for its object to permit obtaining an adjustment of the distribution of temperature at the surface of the substrate in order to correct possible variations of this temperature caused by imperfections of the apparatus and/or by the treatment process itself. The invention further has for its object to permit obtaining controlled and very rapid variations of the temperature of the substrate.

According to the present invention, a treatment apparatus of the type indicated in the opening paragraph is characterized in that at the supporting surface also a plurality of exhaust openings is present communicating with an exhaust space and an exhaust outlet through which exhaust openings gas from between the substrate and the supporting surface can be exhausted, so that, while maintaining the gas cushion, gas injected through each of the injection openings is exhausted through adjacent exhaust openings.

The apparatus according to the invention has the advantage that the gas injected under the back surface of the substrate from each of the injection openings is exhausted through at least one of the adjacent exhaust openings without it being possible for the gas to reach the periphery of the substrate and thus to escape into the vacuum chamber. Thus, the gas injected under the back surface of the substrate does not interfere with the treatment gas otherwise introduced into the chamber and can be chosen independently, inter alia taking into account its thermal conduction properties.

Furthermore, as each portion of gas injected under the substrate is exhausted in the immediate proximity of its point of injection, the delay of establishing a stationary state of pressure under the back surface of the substrate is considerably reduced with respect to the device according to the prior art, for example when it is desirable to change rapidly from a state of high thermal conduction to a state of very low thermal conduction between the substrate and its support.

Advantageously, the injection openings are identical to each other and at least the major part of the exhaust openings are also identical to each other, the former being distributed according to a first given density of positions per unit surface area of the supporting surface of the substrate support while the latter are distributed according to a second given density of positions per unit surface area. The first and second densities of openings can be chosen to be constant at the supporting surface of the support and to be, for example, practically identical.

This is especially the case for a treatment apparatus in which a comparatively high residual treatment gas pressure is used, i.e. higher than or substantially equal to the average pressure of the gas cushion under the back surface of the substrate. In this case, in fact, the substrate is not subjected to an elastic deformation and is in uniform and fairly narrow contact with the front wall of the support. Consequently, a substantially uniform heat exchange between the substrate and the support can be suitable to ensure a good homogeneity in temperature at the surface of the substrate.

However, in the apparatus according to the invention, it can also be ensured that at least one of the densities of openings, for example the density of the injection openings, varies over the surface of the support as a function of the position. This variation realized intentionally permits locally modifying the heat exchange between the support and the substrate and providing a correction of temperature differences of the substrate ensuing from the treatment conditions. An example of temperature differences ensuing from the treatment condition is given by the utilization of a residual pressure in the vacuum chamber which is lower than the average pressure applied under the back surface of the substrate. In the latter case, it is necessary to fix the substrate on the support, which is obtained in known manner by fixing means exerting a force at the periphery of the substrate. The difference in pressure on either side of the substrate results in an appreciable deformation of the substrate (in a curved form) so that the distance between the substrate and the supporting surface of the support varies along the diameter of the substrate. As a result, a variation of the thermal conduction of the thin gas layer of variable thickness under the substrate is obtained, which can be compensated for at least the major part by a suitable variation of the density of the injection openings and/or by a variation of the density of the exhaust openings. Other temperature inhomogeneities of the substrate can further be due to an imperfection of symmetry in the construction of the apparatus and/or in the configuration of the plasma formed therein. These defects can also be corrected essentially by means of a variable density of openings on the surface of the substrate support. Such a correction can be obtained by an approximated calculation from a record of temperatures during a preliminary and experimental operation in operating conditions similar to those of the envisaged treatment, or in a simpler manner by essentially experimental means by carrying out successive tests, in which given injection openings are eliminated (by blocking them), and the effect obtained on the temperature distribution on the substrate is observed.

Instead of using a variation of the density of injection openings and/or exhaust openings, which are identical to each other for the same category, use may also be made, in order to obtain a correction of the temperature distribution of the substrate, of a variation of the diameters of the openings, while the densities of these openings per unit surface area would be chosen, for example, to be uniform.

When an initial adjustment of the temperature uniformity of the substrate is effected essentially by experiments, the apparatus according to the invention offers the facility of arbitrarly combining modifications of densities and diameters of openings, especially by enlargement of given injection openings.

From theoretical considerations, which will be given hereinafter, it results that in general the exhaust openings have a diameter largely exceding that of the injection openings and typically at least ten times larger.

BRIEF DESCRIPTION OF THE DRAWINGS

Other particulars, details and advantages of the invention will be explained by the following description and by means of the accompanying drawings, given by way of non-limitative examples, in which:

FIG. 1 shows diagrammatically in sectional view an apparatus for treating substrates according to the invention;

FIG. 2 is an elevation of the substrate support forming part of the apparatus of FIG. 1, shown diagrammatically and in sectional view on an enlarged scale;

DESCRIPTION OF THE INVENTION

Figure 3:
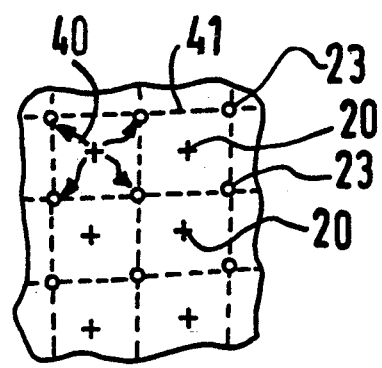
FIGS. 3 and 4 show examples of distributions of injection openings and of exhaust openings over a part of the surface of the substrate support.

In FIG. 1 an apparatus 1 for treating flat substrates under reduced pressure is shown diagrammatically. It comprises a vacuum chamber consisting of two parts 2a, 2b, which is provided with an exhaust outlet 3 connected to pumping means 4. The vacuum chamber 2a, 2b also comprises an inlet 5 being connected to a reservoir 6 of treatment gas via a flow control device 7. A substrate 10 to be treated is disposed on a support 11, having a body 11a comprising means for heating and/or cooling the support, for example a heating resistor 12 embedded in the body 11a of the support.

The apparatus 1 also comprises a supplementary gas inlet 15 for injecting a gas intended to establish a better thermal contact, via a heat exchanging gas cushion, between the support 11 and the substate 10. For this purpose, a reservoir 16 of this gas is connected to the supplementary inlet 15 through a flow control device 17. At the supporting surface 11b of the support 11 a plurality of injection openings 20 is present distributing under the back surface of the substrate 10 the gas originating from the reservoir 16, whose flow is controlled by the device 17. The plurality of injection openings 20 communicates with an injection space 21, which is provided in the carrier 11 and is situated for example between the surface 11b and the body 11a of the support.

Another plurality of openings, designated as exhaust openings 23, is also present at the surface 11b of the support. The latter openings 23 are in communication with an exhaust space 24, which is adjacent to the body 11a of the support on the side opposite to the surface 11b and this exhaust space 24 is connected to an additional exhaust outlet 25, which is connected to additional pumping means 26.

The broken line 150 connecting the outlet of the additional pumping means 26 to the supplementary inlet 15 indicates diagrammatically that in the case of use of an expensive gas, such as helium, the latter can be recycled in the apparatus, the reservoir 16 then supplying only the contribution corresponding to leaks.

The apparatus shown in FIG. 1 is susceptible to utilizing a plasma for activating the treatment gas and for this purpose comprises an electrode 30 disposed at a certain distance from and parallel to the substrate 10, whose supporting pin 31 traverses the vacuum chamber 2a through a vacuum tight and electrically insulating sealing 31. The supporting pin 31 is electrically connected to a terminal 33 for the electric supply of the plasma, this supporting pin 31 being hollow and constituting the supply duct of the treatment gas. Finally, the treatment gas reaches the vacuum chamber 2a, 2b by means of a technique known per se by passing through the hollow interior of the electrode 30 through its front wall 30a, which is provided with multiple perforations, along the trajectory indicated by the arrow 34.

The treatment apparatus 1 further comprises means for fixing the substrate 10 on its support 11, which means are shown at 35 and also form part of the known technique so that it is not necessary to describe them in greater detail.

For the utilization of the plasma, the substrate 10 forms the second electrode of the system and is carried out to the required potential by conduction with the support 11, which, according to circumstances, can be carried to the potential 0 (ground) or to another potential by means of an electrical connection leading to the terminal 36, which requires insulating passages 37 and 38 for the outlets to the exterior of the vacuum chamber of the means 35 for fixing the substrate and of the part in the shape of a pin of the support 11.

For the sake of clarity, FIG. 1 only shows a few openings 20 and 23 of each of the types in the support 11, while actually a considerable number of injection openings 20 and exhaust openings 23 are provided in the support 11.

FIG. 2, which is an enlarged sectional view of a part of the support 11, permits of explaining more clearly how this support can be obtained. In FIG. 2, the elements corresponding to those of FIG. 1 are provided with the same reference symbols. As indicated in FIG. 2, the body 11a of the support 11 can be formed in two parts so that it can readily accommodate the heating coil 12 provided with its insulating sheath, this heating coil having a polongation 27 connected at the exterior of the chamber to the current source regulated for heating the support 11. The front wall of the carrier 11 is provided with small injection openings 20 present at the supporting surface 11b having a diameter of, for example, 0.1 mm and communicating with the injection space 21. The injection space 21 communicates in turn with an inner tube 28 situated in the axis of the support 1 and serving to take along the gas to be injected under the back surface of the substrate. The injection space 21 is traversed by tubes 29, one of the ends of which constitutes one of the exhaust openings 23, while the other end is in communication with the exhaust space 24 situated on the other side with respect to the injection chamber 21 of the body 11a of the carrier 11. The exhaust space 24 made to communicate with the outlet 25 (cf. FIG. 1) by means of an outer tube 18, which is concentrical with the inner tube 28. As can be seen in FIG. 2, the support 11 further comprises a peripheral groove 22 intended to complete the aspiration of the gas introduced under the back surface of the substrate at the periphery thereof. The peripheral groove 22 is caused to communicate with the exhaust space 24 by means of one or several supplementary exhaust openings 13 distributed along the perimeter of the support 11. The exhaust openings 23 have a diameter exceeding the diameter of the injection openings 20 and, for example, in the proximity of 2 mm.

The body 11a of the support 11 has just been described so as to provide for a heating of the substrate 10. In other cases, on the contrary, it is necessary to keep the substrate 10 at a low temperature and it is possible to cool it when the treatment has the effect of supplying it with energy. To this aim, the support is then slightly modified according to an embodiment not shown, in which the heating coil 12 is eliminated, while the groove containing this wire constitutes a canalization in which a cooling liquid kept at a regulated temperature is circulated.

According to the invention, the gas serving to increase the heat exchange between the substrate and the support is distributed under the surface of the substrate by a large number of injection openings 20 and exhausted after a short path between the support and the substrate through also a large number of exhaust openings 23. Thus, the gas injected between the back surface of the substrate and the support is exhausted substantially entirely. Therefore, there is substantially no leakage of this gas toward the vacuum chamber in which the latter would be mixed with the treatment gas; the atmosphere in the vacuum chamber is therefore not disturbed. The presence of a peripheral groove 22 on the supporting surface of the support 11 reduces further the small possibilities of leakage toward the atmosphere of the chamber. The invention therefore has the advantage that the kind of gas which is used for increasing the heat exchange between the support 11 and the substrate 10 as well as its pressure and its flow rate can be chosen at will.

Figure 4:
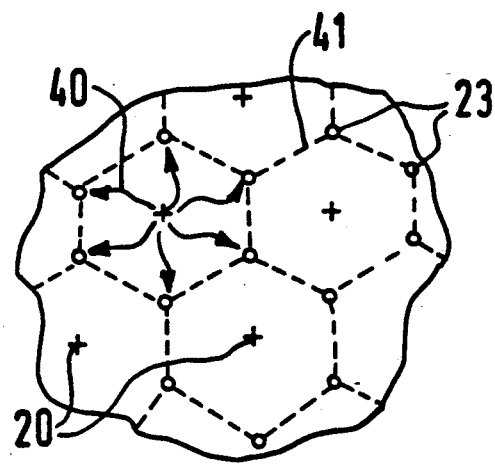

In a first embodiment of the invention, injection openings 20 can be provided having identical diameters and distributed in a given density designated as first density per unit surface area of the front surface of the support 11 and exhaust openings can be provided which are also identical to each other and are distributed in a second given density on the front surface of the support. FIGS. 3 and 4 show examples of distributions of injection openings 20 and of exhaust openings 23 on a part of the front surface of the support 11. In these Figures, the arrows 40 indicate diagrammatically the trajectory of the gas leaving the injection openings 20 and directed toward the exhaust openings 23. The dotted lines 41 joining adjacent exhaust openings 23 subdivide the surface into cells indicating very diagrammatically where the gas originating from each of the injection openings 20 circulates. FIG. 3 shows an example of uniform distribution of the injection and exhaust openings, the density of these openings of one and the other category being identical. FIG. 4 shows another example of uniform distribution of the openings at the surface of the support, but now the density of the exhaust openings is twice the density of the injection openings per unit surface area. One or the other of these embodiments, in which the densities of the injection openings and of the exhaust openings are substantially constant at the surface of the support 11 is very suitable when the treatment apparatus operates at a pressure of the treatment gas which is equal to or higher than the average pressure which is established on the back surface of the substrate. In this case, in fact the substrate is not deformed and accurately engages the support. The distance between the back surface of the substrate and the surface of the support on a microscopic scale is related with the roughness of the pieces present and remains statistically constant on an average over the whole surface of the substrate. To the extent to which the caloric losses by radiation of the substrate and/or the quantity of heat resulting from the energy produced at the substrate by the plasma are substantially uniform, this mode of construction leads, on an average, to a uniform heat exchange between the substrate and the support and therefore to a uniform distribution of the temperature of the substrate. As will be discussed in greater detail hereinafter, the caloric exchange between the substrate and the support is subjected to periodical variations after the localiztion of the openings, but these fluctuations can be made sufficiently small and insignificant because of the thermal conduction of the substrate itself by choosing a sufficiently high density of the injection and exhaust openings or by increasing the average gas pressure on the back surface of the substrate.

It should be noted that, when the apparatus operates at a residual treatment gas pressure higher than the average pressure established on the back surface of the substrate, the means 35 for fixing the substrate, such as shown in FIG. 1, can be eliminated.

Figure 5:
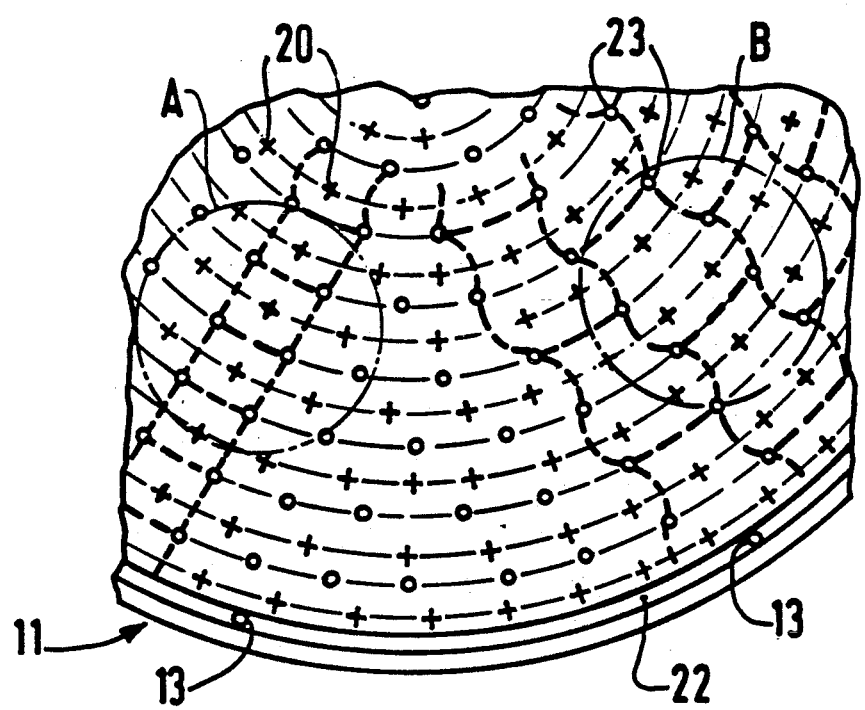
FIG. 5 is a partial view of a part of the surface of the substrate support showing another example of distribution of injection openings and discharge openings an the use of a peripheral groove for the exhaust.

FIG. 5 relates to another embodiment of the invention and shows another example of distribution of the injection openings 20 and of the exhaust openings 23 on a part of the surface of the support 11. In order to locally modify the heat exchange between the substrate and the support and to correct the temperature differences of the substrate ensuing from the treatment conditions in the mode of construction shown in FIG. 5, one of the densities of openings varies as a function of the position. In the example shown, the density of injection openings 20 per unit surface area of the support is substantially constant, while the density of the exhaust openings 23 is higher in the region limited by the circle A than in the region limited by the circle B, in which it is only ⅔ of the density of the region A. Thus, the heat exchange between the substrate and the support can be increased in the region B as compared with the heat exchange corresponding to the region A so that a temperature difference of the substrate can be corrected, which could have been observed by utilizing a substrate having uniform densities of openings. FIG. 5 shows also at the periphery of the support 11 the peripheral groove 22 and two supplementery discharge openings 13.

Another method can be utilized to obtain a correction of the temperature differences at the surface of the substrate, which method is based on a sequence of experiments in which successive local corrections are effected. From given densities of injection openings and exhaust openings, the distribution of the temperature of the substrate is observed in conditions corresponding to a particular method. Subsequently, local corrections are effected in the heat exchange between the support 11 and the substrate 10, either by stopping per position locally one or several injection openings so as to decrease the heat exchange or by stopping locally one or several exhaust openings so as to increase the heat exchange at this given area. An increase of the diameter of given injection openings by boring would also result in a local increase of the heat exchange comparable with the effect of the stopping of given exhaust openings. As can be seen, the invention thus permits, while causing the density of the injection openings and/or the density of exhaust openings or the ratio between these densities of openings or the diameter of given openings to vary locally, of considerably reducing the temperature difference which can be observed at the surface of the substrate during a given treatment process. By way of example, causes can be mentioned leading to a lack of homogeneity of the temperature of the substrate: losses by radiation of the heated substrate, which are inhomogeneous and more particularly are different between the center and the edge of the substrate, a power emitted by the plasma and transformed into heat in the substrate which is inhomogeneous because of the construction of the apparatus, and finally the deformation of the substrate (or curvature) due to a pressure difference between the back surface and the front surface of the substrate when the atmosphere of the vacuum chamber is at a pressure lower than the average pressure of the gas circulating between the back surface of the substrate and the support. In the last-mentioned case, the substrate 10 is immobilized on the support 11 by fixing means 35, which exert a force at the periphery of the substrate. The distance between the back surface of the substrate 10 and the supporting surface 11b of the support 11 and consequently the thickness of the cushion of gas varies along a substrate diameter. Therefore, a heat exchange is obtained which varies also along a diameter and this variation can be corrected by the means according to the invention which have just been indicated.

Figure 6:
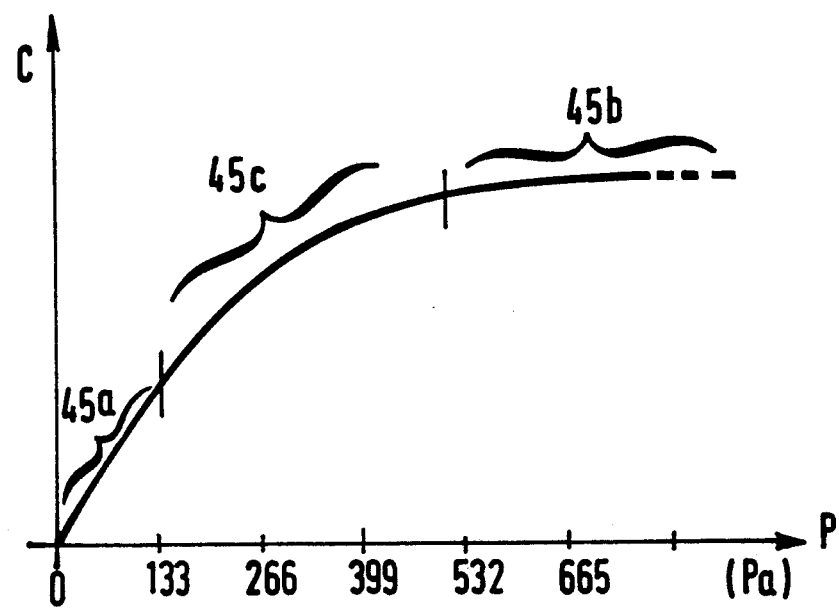
FIG. 6 shows a diagram representing the variation of the thermal conductivity C of a thin layer of gas of a given small thickness as function of the pressure P.

FIG. 6 indicates diagrammatically the variation of the heat conduction C per unit surface area of a thin cushion of a given gas, for example helium, as a function of the pressure P. An arbitrary scale is chosen for the values C due to the fact that these values depend upon the thickness of the cushion of gas. However, the form of the curve remains substantially the same for sufficiently thin cushions of different thicknesses. The part of the curve indicated by 45a shows that the conduction C per unit surface area is substantially proportional to the pressure P for the small values of the pressure (that is to say below 100 Pa).

This curved part corresponds to the fact that the thickness of the gas cushion is lower than or of the same order as the average free path of the gas molecules and in this case the conduction per unit surface area is not very sensitive to the thickness of the gas layer. In the curved part indicated by 45b, the conduction on the contrary becomes substantially independent of the pressure, but it is then inversely proportional to the thickness of the gas cushion, which behaves like a fluid with laminar flow. The intermediate curved part indicated by 45c in the Figure indicates that the conduction is obtained by means of a mixed process, which is influenced both by the pressure and by the thickness of the gas cushion.

From a practical point of view, when the temperature differences of the substrate should be corrected by means of a nonuniform density of injection openings and/or of exhaust openings, use is to be made of conditions of gas injection under the back surface of the substrate situated in the curve parts 45a or 45c of FIG. 6 and preferably in the part 45c in which the conduction is higher, while remaining influenced by the gas pressure applied locally under the back surface of the substrate.

By means of an example, it will now be explained how the diameters of the injection and exhaust openings can be approximately determined in the case of a density of uniform distribution under the surface of a substrate of 150 mm in diameter.

A density of injection openings is fixed equal to the density of exhaust openings and equal to 1 opening/cm$^2$, which can readily be obtained in practice.

The number of openings N of each kind is therefore approximately 175. It is supposed that the limit flow rate De of the additional exhaust outlet 25 is 22 l/s at a pressure of the order of 10 Pa, which corresponds to the desired pressure Pe at the level of the exhaust openings. This limit flow rate De can be the real flow rate of the pumping means 26 or a flow rate limited at will to this value by a regulating valve at the inlet of the pumping means 26, whose pumping capacity would be higher.

The flow rate of gas injected per second through all of the injection openings at a pressure Pi of about 1000 Pa envisaged at the inlet of the injection openings (and hence higher than the desired average pressure) is given by:

$$De = \frac{Pe}{Pi} \text{ i.e. about 0.22 l/s}$$

or for each the injection openings:

$$De = \frac{Pe}{Pi} /N \text{ i.e. about } 1.25 \ 10^{-3} \text{ l/s.}$$

Now such a flow rate is obtained approximately at the limit speed V* of the flow of the gas (of the order of 200 m/s for a gas at a pressure of the order of 100 Pa) in an injection opening having a section s.

It follows that:

$$s = \frac{Pe}{Pi} \cdot \frac{De}{V^* N} \text{ i.e. about } 0.6 \ 10^{-4} \text{ cm}^2$$

and a diameter d of injection openings:

$$d = \left( \frac{4}{\pi} \cdot \frac{Pe}{Pi} \cdot \frac{De}{V^* N} \right)^{\frac{1}{2}} \text{ i.e. about } 0.9 \ 10^{-2} \text{ cm,}$$

which is rounded off to 0.1 mm.

As to the exhaust openings, their diameter could be evaluated on first approximation as being multiplied by a factor $(Pi/Pe)^{\frac{1}{2}}$, i.e. a factor 10 in our example. However, this approximation does not take into account the diminuation of the limit speed V* at the pressure Pe desired, which is low, of the order of 10 Pa, and does not take into account either the loss of charge, which is considerable in this case and occurs along the length of the exhaust opening. A more precise evaluation shows that the factor to be taken into account for determining a diameter of exhaust openings with which effectively a desired pressure Pe of 10 Pa is obtained at the level of the exhaust openings, takes the form:

$$\alpha(Pi/Pe)^{\frac{1}{2}},$$

where α is a coefficient generally lying between 1.5 and 3 and close to 2 in our example.

The result is that the diameter of the exhaust openings is chosen to be equal to 2 mm.

It will be clear that in the treatment apparatus according to the invention, the thermal conduction between the substrate and the support varies periodically as a function of the position because of the periodical variations of the pressure of the gas circulating therein.

However, the thermal conductivity of the substrate is generally sufficient to limit the fluctuations of temperature of the substrate on either side of its average temperature.

In the example described hereinbefore, it is found that for a substrate of silicon the temperature fluctuations are smaller than 5° C. when the power dissipated by the substrate is 1 W/cm$^2$.

Of course, by increasing the density of the openings, the residual temperature fluctuations of the substrate can be reduced to a certain extent and the flexibility of regulation of the temperature can be increased when this temperature must be locally adjusted. A reduction of the residual fluctuations of the temperature of the substrate can also be obtained by reducing the pumping speed of the pumping means 26. Thus, the result is an elevation of the pressure at the level of the exhaust openings and hence an increase of the average pressure under the back surface of the substrate.

In the description given hitherto, there is especially indicated how the apparatus according to the invention can be used to obtain a given distribution of the temperature of the substrate, but considered in a stationary state of equilibrium. The invention moreover has the advantage of permitting rapid variations of the temperature of the substrate by a modification of the average pressure of the gas layer formed between the substrate and the support and hence because of an intentional variation of the heat exchange between these elements. As has already been stated, such modifications in pressure are obtained more rapidly in the apparatus according to the invention due to the short path of the gas injected under the substrate between its injection point and its exhaust point.

Therefore, also an important application of the invention lies in the field of the rapid heat treatments.

For example, if during the step of heating the support 11, the flow of gas originating from the reservoir 16 is eliminated while effecting a pumping through the exhaust openings 23, the heat exchange between the substrate 10 and the support 11 is very small due to the fact that the space separating them is under vacuum. The temperature of the substrate 10 does not follow the elevation of temperature of the support 11. When the latter has reached its nominal temperature, a flow of gas is applied in the injection openings 20 so that the substrate is then brought rapidly to a temperature close to that of the support.

Figure 7:
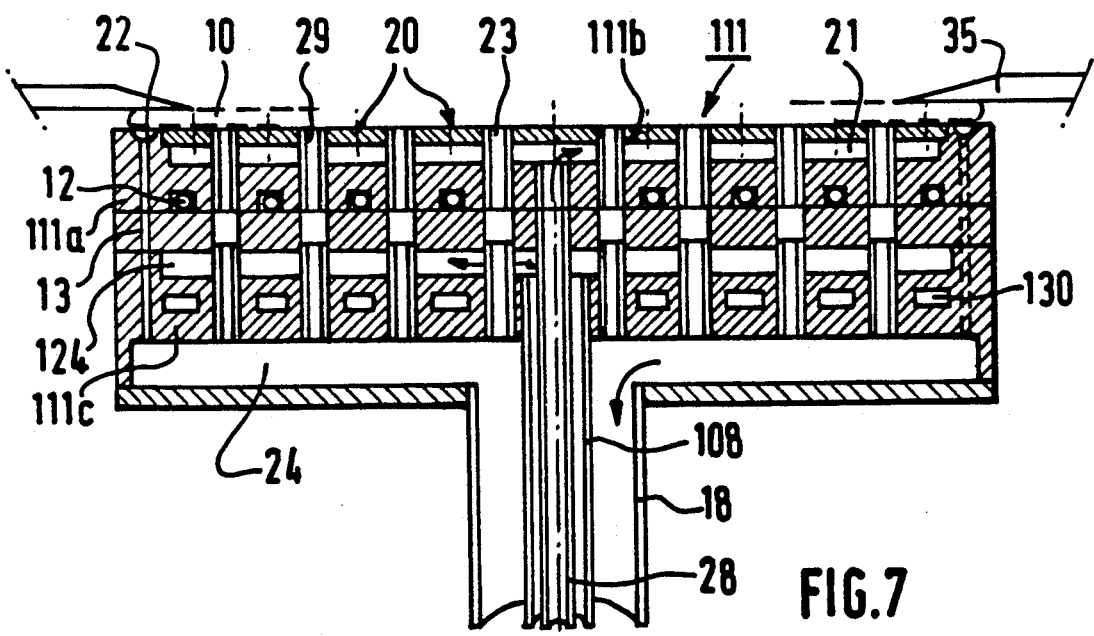
FIG. 7 is an elevation of a substrate support according to another embodiment of the invention.

With reference to FIG. 7, an embodiment of the invention will now be described, which permits of obtaining also a rapid cooling of the substrate at the end of the treatment.

FIG. 7 is an elevation analogous to that of FIG. 2 relating to a support 111 modified with respect to that of FIG. 2 by the addition of a supplementary part 111c of the support body adjacent to the part 111a of the carrier, but nevertheless separated therefrom by a supplementary space 124. Certain elements corresponding to those in FIG. 2 are provided with like reference symbols.

The actual exhaust space 24 has been located at the back of the supplementary part 111c of the support body. While the part 111a of the support body is heated by a coil 12, the supplementary part 111c is on the contrary cooled by circulation of (for example) water in a meandering cavity shown diagrammatically at 130. The supplementary space 124 is connected to an intermediate tube 108 concentrical with the tubes 18 and 28, in which at will a vacuum can be established or a pressure of a gas having a high thermal conductivity can be produced.

Thus, the supplementary space 124 plays the part of a heat exchanger having a variable efficiency, which permits of thermally isolating the part 111a of the support body when it is heated by the coil 12 with respect to the part 111c which is cooled and of then cooling rapidly the part 111a—and also the substrate 10—when the supply of the resistor 12 is stopped and a gas pressure is produced in the supplementary space 124.

Figure 8:
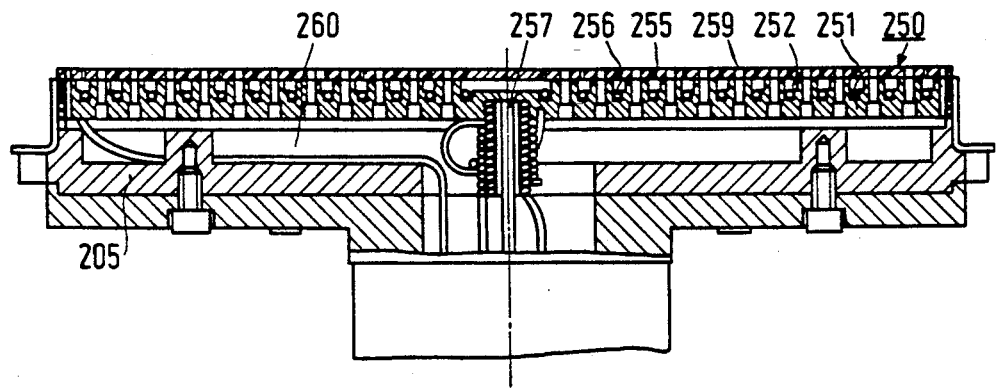
FIG. 8 shows a sectional view taken on the line III—III of FIG. 9 of a further embodiment of the substrate support.
Figure 9:
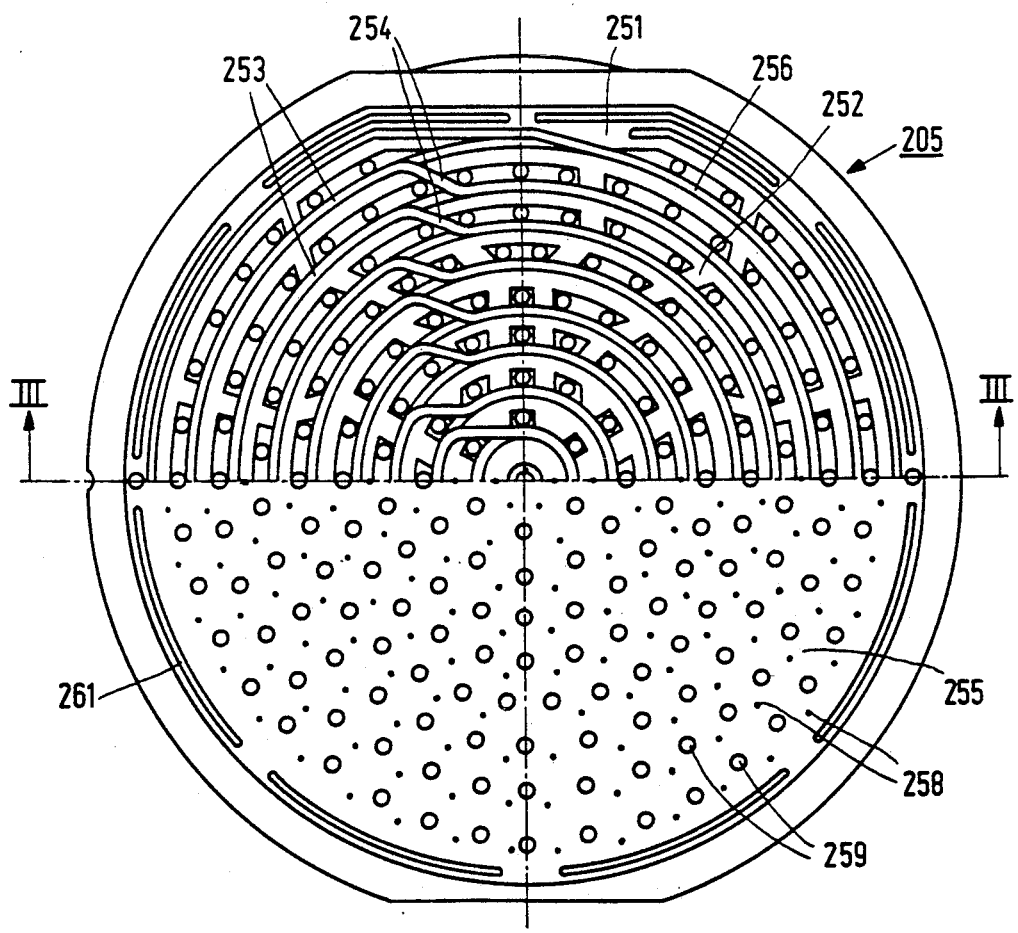
FIG. 9 shows a plan view of the support of FIG. 8.

FIGS. 8 and 9 show a further embodiment of a substrate support according to the present invention.

In order that the treatment at a high temperature can be carried out, the upper part of the workpiece support 205, is therefore provided with an electric heating device 250. This device is shown in vertical sectional view on an enlarged scale in FIG. 8. This heating device has a plate 251, in which circular grooves 252 having a stepped cross-section are formed so as to be regularly distributed over the surface of the plate.

The regions of the grooves 252 located more deeply, which are arranged on circles 253 concentric to each other, which are interconnected through connection sections 254 from one circle to the next circle, constitute a gutter extending from the center of the plate outwards along a series of lines for receiving a heater coil 256, as appears from FIG. 9, which shows in one half of the Figure a plan view of the plate 251.

In the other half of FIG. 9, the view of a further plate 255 is shown, which covers the plate 251 and is connected thereto. By this further plate 255 the grooves 252 arranged so as to be distributed over the whole plate surface and also communicating with each other in radial direction are covered so that ducts are formed for the gas distribution.

As appears from FIG. 8, each groove 252 has a stepped cross-section and consists of a wider upper region and a narrower lower region, in which the electric heater coil 256 is arranged, which extends from the center of the plate to the edge of the plate. The upper wider groove region constitutes a distribution space, which is connected to a duct 257 for supplying gas merging at the center of the plate into the grooves 252. The covering plate 255 has a plurality of small bores 258, which are distributed regularly over its surface, pass through the plate and merge into the grooves 252. Through these bores 258, the gas flowing through the grooves 252 emanates, after which it constitutes a gas cushion between the surface of the plate 255 and the workpiece disposed thereon.

The gas serves to increase the heat transfer from the surface of the plate 255 to the back side of the workpiece. Moreover, the gas guarantees that the workpiece is heated fully uniformly throughout its surface. Thus, the workpiece may be heated, for example, to 500° C. In order to exhaust again this gas cushion, the plate 251 and the covering plate 255 have a plurality of bores 259, which are uniformly distributed over the plate surface, but extend beside the grooves 252 and along the latter, and pass through both plates in line with each other. These bores merge under the plate 251 into a gas exhaust space 260, from which the gas is conducted away. Slot-shaped openings 261 along the plate edge also serve for gas exhaust in order to ensure that the gas does not reach the processing space.

Without operation of the heater coil, the gas cushion and the gas supply and gas discharge especially also serve for cooling of a workpiece or for discharge of the heat.

It is clear that numerous variations of the apparatus are possible for those skilled in the art with respect to those described above, but these variations do not depart from the scope of the present invention in the appended Claims.

I claim:

1. Apparatus for treating a flat substrate (10) under reduced pressure comprising a vacuum chamber (2a, 2b) provided with a substrate support (11) having a body (11a) with heating and cooling means (12) and a supporting surface (11b) at which a plurality of injection openings (20) is present communicating with an injection space (21) and a supplementary gas inlet (28), through which injection openings a gas can be supplied between the substrate and the supporting surface for forming a heat-exchanging gas cushion therebetween, characterized in that at the supporting surface (11b) also a plurality of exhaust openings (29) is present communicating with an exhaust space (24) and an exhaust outlet

(18) through which exhaust openings gas formed between the substrate (10) and the supporting surface can be exhausted, so that, while maintaining the gas cushion, gas injected through each of the injection openings is exhausted through adjacent exhaust openings.

2. Apparatus as claimed in claim 1, characterized in that the injection openings are identical to each other and are distributed according to a first given density of positions per unit surface area of the surface of the support and at least the major part of the exhaust openings are also identical to each other and are distributed according to a second given density of positions per unit surface area of the surface.

3. Apparatus as claimed in claim 2, characterized in that the first density of injection openings is substantially constant on the surface and in that the second densisty of exhaust openings is also substantially constant on the surface.

4. Apparatus as claimed in claim 3, characterized in that the said first density of openings is substantially equal to the said second density of openings.

5. Apparatus as claimed in claim 2, characterized in that among the first density of injection openings and the second density of exhaust openings at least one of these densities varies as a function of the position on the surface of the support in order to modify locally the heat exhange between the substrate and the support and to correct temperature differences of the substrate resulting from the treatment conditions.

6. Apparatus as claimed in claim 1, characterized in that the diameter of at least one of the pluralities of openings varies as a function of the position on the surface of the support in order to locally modify the heat exchange between the substrate and the support.

7. Apparatus as claimed in claim 1, characterized in that for a total number of injection openings lying between 100 and 200 the diameter of the injection openings lies between 0.05 and 0.2 mm, while the diameter of the exhaust openings lies between 1 and 3 mm.

8. Apparatus as claimed in claim 1, characterized in that the surface of the support on which the substrate bears comprises a peripheral groove communicating with the exhaust space by means of at least one supplemenatary exhaust opening.

9. Apparatus as claimed in claim 8, characterized in that the substrate support comprises a body which is moreover provided with a supplementary part, which is cooled, while the body part having said heating and cooling means is heated, in that this supplementary part is situated opposite to the supporting surface of the support adjacent to the body part being heated, but separated from the latter by a supplementary space, which is connected to a tube from which at will and successively a vacuum and a pressure of given fluid can be established in the supplementary space.

10. Workpiece carrier for a disk-shaped workpiece to be subjected to a surface treatment, comprising a workpiece support, which constitutes a supporting surface for the workpiece, a heating and/or cooling means for the workpiece support, a plurality of emanation openings, which are distributed along and merge into the supporting surface and communicate with a distributor space, and a gas inlet connected to the distributor space for supplying a gas via the distributor space and the emanation openings for forming a heat-transferring gas cushion between the supporting surface and the workpiece, characterized in that in addition to the emanation openings (258) a plurality of exhaust openings (259) merge into the supporting surface, which communicate with a gas exhaust space (260), to which a gas exhaust outlet is connected.

11. Workpiece carrier as claimed in claim 10, characterized in that the emanation openings (258) are identical to each other.

12. Workpiece carrier as claimed in claim 11, characterized in that the emanation openings (258) are regularly distributed along the workpiece support (205).

13. Workpiece carrier as claimed in claim 10, characterized in that at least the major part of the exhaust openings (259) are formed in the same manner.

14. Workpiece carrier as claimed in claim 13, characterized in that at least the major part of the exhaust openings is uniformly distributed along the workpiece support (205).

15. Workpiece carrier as claimed in claim 10, characterized in that, viewed from the supporting surface, the gas extraction space (260) is located under the distributor space (252).

16. Workpiece carrier as claimed in claim 10, characterized in that the exhaust opening are formed along the periphery of the workpiece support (205) as grooves (261) extending along it through the covering plate (255).

17. Workpiece carrier as claimed in claim 16, characterized in that the grooves (261) extend through the plate (251).

18. Workpiece carrier for a disk-shaped workpiece to be subjected to a surface treatment, comprising a workpiece support, which constitutes a supporting surface for the workpiece, a heating and/or cooling means for the workpiece support, a plurality of emanation openings, which are distributed along and merge into the supporting surface and communicate with a distributor space, and a gas inlet connected to the distributor space for supplying a gas via the distributor space and the emanation openings for forming a heat-transferring gas cushion between the supporting surface and the workpiece, characterized in that in addition to the emanation openings (258) a plurality of exhaust openings (259) merge into the supporting surface, which communicate with a gas exhaust space (260), to which a gas exhaust outlet is connected and a vacuum processing chamber for treating workpieces comprising at least one said workpiece carrier.

19. Method of manufacturing electronic devices, in which a flat substrate is treated under reduced pressure in a vacuum chamber (2a, 2b) provided with a substrate support (11) having a body (11a) with heating and/or cooling means (12) and a supporting surface (11b) at which a plurality of injection openings (20) in present communicating with an injection space (12) and a supplementary gas inlet (28), in which method through said injection openings a gas is supplied between the substrate and the supporting surface for forming a heat-exchanging gas cushion therebetween, characterized in that, through a plurality of exhaust openings (29), which are also present as the supporting surface (11b) and which are communicating with an exhaust space (24) and an exhaust outlet (18), gas from between the substrate and the supporting surface is exhausted, so that, while maintaining the gas cushion, gas injected through each of the injection openings is exhausted through adjacent exhaust openings.

20. Workpiece carrier as claimed in claim 10, characterized in that the disk-shaped workpiece is disposed in a vacuum apparatus for surface treatment.

21. Apparatus as claimed in claim 1, characterized in that the flat substrate is a semiconductor wafer.

22. Method as claimed in claim 19, characterized in that the flat substrate is a semiconductor wafer used in the manufacture of integrated circuits.

* * * * *